(12) United States Patent
Soundarapandian et al.

(10) Patent No.: US 8,674,352 B2
(45) Date of Patent: Mar. 18, 2014

(54) OVERVOLTAGE TESTING APPARATUS

(75) Inventors: Kannan Soundarapandian, Murphy, TX (US); Benjamin Amey, Allen, TX (US); Timothy P. Duryea, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/407,493

(22) Filed: Feb. 28, 2012

(65) Prior Publication Data

US 2013/0221342 A1    Aug. 29, 2013

(51) Int. Cl.
*H01L 29/10*    (2006.01)

(52) U.S. Cl.
USPC ............... 257/43; 438/85; 438/86; 438/104; 438/754; 257/70; 257/362; 257/508; 257/401

(58) Field of Classification Search
USPC ........ 257/43, 170, 362, 508, 401; 438/85, 86, 438/104, 754
See application file for complete search history.

(56) References Cited

U.S. PATENT DOCUMENTS

| | | | | |
|---|---|---|---|---|
| 4,882,610 A | * | 11/1989 | Theus et al. | 257/362 |
| 5,548,224 A | * | 8/1996 | Gabriel et al. | 324/750.3 |
| 6,242,298 B1 | * | 6/2001 | Kawakubo | 438/239 |
| 8,026,177 B2 | | 9/2011 | Meinel et al. | |
| 8,363,365 B2 | * | 1/2013 | Fukuoka et al. | 361/54 |
| 2001/0004124 A1 | * | 6/2001 | Noda et al. | 257/401 |
| 2003/0173639 A1 | * | 9/2003 | Pernyeszi | 257/500 |
| 2007/0121274 A1 | * | 5/2007 | Talvacchio et al. | 361/311 |
| 2009/0166875 A1 | | 7/2009 | Pendharkar et al. | |
| 2009/0250784 A1 | | 10/2009 | Meinel et al. | |
| 2012/0175727 A1 | * | 7/2012 | Lin et al. | 257/508 |
| 2012/0242400 A1 | * | 9/2012 | Shaeffer et al. | 327/536 |
| 2012/0286327 A1 | * | 11/2012 | Coyne | 257/170 |
| 2013/0063863 A1 | * | 3/2013 | Timler et al. | 361/313 |

\* cited by examiner

*Primary Examiner* — Fernando L Toledo
*Assistant Examiner* — Mohammed Shamsuzzaman
(74) *Attorney, Agent, or Firm* — Alan A. R. Cooper; W. James Brady, III; Frederick J. Telecky, Jr.

(57) ABSTRACT

An apparatus is provided. In the apparatus, there is comprises a substrate with a first region of a first conductivity type, a second region of a second conductivity type that is substantially surrounded by the first region, and a third region of the second conductivity type that is substantially surrounded by the second region. A first dielectric layer is formed over the substrate, and a first conductive layer is formed over the first dielectric layer, which is configured to form a first electrode of a capacitor. A second dielectric layer is formed over the first conductive layer. A plate is formed over the second dielectric layer so as to form a second electrode of the capacitor. A cap is formed over the second dielectric layer, being spaced apart from the plate. A via is electrically coupled to the cap and the third region, extending through the first and second dielectric layers.

21 Claims, 11 Drawing Sheets

OVERVOLTAGE TESTING APPARATUS

TECHNICAL FIELD

The invention relates generally to overvoltage testing and, more particularly, to high voltage (i.e., >100V) overvoltage stress testing (OVST) structures to accelerate latent defects in an integrated circuit (IC).

BACKGROUND

Turning to FIG. 1, a cross-sectional view of a conventional high voltage capacitor CS1 (i.e. >40V) is shown. As shown, this capacitor CS1 is formed of multiple parallel-plate capacitors in what can be referred to as a "sandwich" capacitor. In this configuration, there are three intended parallel-plate capacitors that are formed by: (1) metallization layer 118, dielectric layer 116, and metallization layer 114; (2) metallization layer 114, dielectric layer 112, and metallization layer 110; and (3) metallization layer 110, dielectric layer 108, and polysilicon layer 106. There is also a parasitic capacitor CPAR1 (which is shown in FIG. 2) formed by polysilicon layer 106, dielectric layer 104, and substrate 102. By electrically coupling metallization layers 118 and 110 together, one electrode for capacitor CS1 can be formed at node N1. Additionally, by electrically coupling metallization layer 110 to polysilicon layer 106 at node N2 another electrode for capacitor CS1 can be formed.

In some applications, it may be desirable to use high voltage capacitor CS1 where one plate (namely, polysilicon layer 106) is not tied to the substrate potential. An example of such a circuit can be seen in FIG. 2. For the circuit in IC 201 in system 200, it measures a current flowing through transistor Q1 (where its gate is electrically coupled to pin CNTL). Transistor Q2 is a smaller ration sense FET so that, when current traverses transistor Q2 and resistor R1, amplifier 202 can measure the current. Capacitor CS1 would then provide a filtering function and would not be tied to the substrate potential.

As part of the testing and verification process normally employed for semiconductors, some components are subjected to OVST to accelerate latent defects that may be present from manufacturing. Looking to IC 201 as an example, parasitic capacitor CPAR1 would be subjected to OVST, where the latent defect is the cone defect 120 in dielectric layer 104. For capacitor CS1, the dielectric layer 104 can be referred to as an isolation layer and is generally formed through a shallow trench isolation or STI etching process. Namely, because the substrate 102 generally includes a P-type epitaxial layer, micro-defects (called "cone defects") can "grow" in the epitaxial layer, reducing the thickness of layer 104 at the point of the cone defect. During testing, a high voltage (i.e., 60% greater than the voltage rating of the capacitor CS1) should be applied to capacitor CPAR1 to determine whether capacitor CPAR1 will fail at lower than expected voltages (which could cause functional problems with IC 201) due at least in part to these cone defects.

One problem with this arrangement, however, is that OVST may be difficult to perform. Referring back to the circuit in IC 102, capacitor CS1 is not tied to the substrate potential. This means that components in IC 201 (i.e., transistors Q1 and Q2) would be subjected to the full OVST voltage. Now, assuming, for example, that pin BAT has a 40V rating, the voltage rating on capacitor CS1 can be as high as 80V, which can, for example, place a 60% OVST voltage (i.e., 128V) stress requirement on capacitor CPAR1 to assure capacitor quality. As a result, the components (i.e., transistors Q1 and Q2) would normally also be subjected to 128V in this example if capacitor CPAR1 is subjected to the 60% OVST voltage. Since, however, the pin BAT is rated at 40V in this example, the corresponding components (i.e., transistors Q1 and Q2) are designed to be 45-50V components, meaning that these components (i.e., transistors Q1 and Q2) cannot tolerate 128V. Thus, there is a need for a capacitor that can be subjected to high OVST voltages independent from other components in the IC.

Some examples of conventional systems are: U.S. Pat. No. 8,026,177; U.S. Patent Pre-Grant Publ. No. 2009/0166875; and U.S. Patent Pre-Grant Publ. No. 2009/0250784.pdf

SUMMARY

An embodiment of the present invention, accordingly, provides an apparatus is provided. The apparatus comprises a substrate having: a first region of a first conductivity type; a second region of a second conductivity type that is substantially surrounded by the first region; and a third region of the second conductivity type that is substantially surrounded by the second region; a first dielectric layer formed over at least a portion of the substrate and located over the first, second, and third regions; a first conductive layer formed over at least a portion of the first dielectric layer and located over at least a portion of the first and second regions, wherein the first conductive layer is configured to form a first electrode of a capacitor; a second dielectric layer that is formed over at least a portion of the first conductive layer and located over at least a portion of the first, second, and third regions; a second conductive layer having: a plate that is formed over at least a portion of the second dielectric layer and that is located over at least a portion of the first and second regions, wherein the plate is configured to form a second electrode of the capacitor; and a cap that is formed over at least a portion of the second dielectric layer, that is located over at least a portion of the first, second, and third regions, and that is spaced apart from the plate; and a via that is electrically coupled to the cap and the third region and that extends through the first and second dielectric layers.

In accordance with an embodiment of the present invention, the substrate has a top surface, and wherein the first region further comprises: a buried layer of the first conductivity type that underlies the second region; and a well region that extends from the top surface to buried layer and that located along the periphery of the second region.

In accordance with an embodiment of the present invention, the third region is more heavily doped than the second region.

In accordance with an embodiment of the present invention, the first conductive layer is polysilicon, and wherein the second conductive layer is a metallization layer.

In accordance with an embodiment of the present invention, the metallization layer is formed of aluminum or copper.

In accordance with an embodiment of the present invention, the second region is an epitaxial layer.

In accordance with an embodiment of the present invention, the first dielectric layer is an oxide isolation layer, and wherein the well region and buried layer are N-type regions, and wherein the second and third regions are P-type regions.

In accordance with an embodiment of the present invention, an apparatus is provided; The apparatus comprises a first supply pad; a second supply pad; a test pad; and an integrated circuit having: a substrate; a capacitor having: a first region of a first conductivity type formed in the substrate; a second region of a second conductivity type that is formed in the substrate and that is substantially surrounded by the first region; and a third region of the second conductivity type that is formed in the substrate and that is substantially surrounded by the second region; a first dielectric layer formed over at least a portion of the substrate and located over the first, second, and third regions; a first conductive layer formed over at least a portion of the first dielectric layer and located over at least a portion of the first and second regions; a second dielectric layer that is formed over at least a portion of the first conductive layer and located over at least a portion of the first, second, and third regions; a second conductive layer having: a plate that is formed over at least a portion of the second dielectric layer and that is located over at least a portion of the first and second regions; and a cap that is formed over at least a portion of the second dielectric layer, that is located over at least a portion of the first, second, and third regions, and that is spaced apart from the plate, and that is electrical coupled to the test pad; and a via that is electrically coupled to the cap and the third region and that extends through the first and second dielectric layers; and an internal circuit that is electrically coupled to the first supply pad, the second supply pad, the first conductive layer of the capacitor, and the plate.

In accordance with an embodiment of the present invention, the first conductive layer of the capacitor is electrically coupled to the first supply pad, and wherein the internal circuit further comprises: a resistor that is electrically coupled to the first supply pad; and an amplifier that is electrically coupled to the first supply pad and the test pad.

In accordance with an embodiment of the present invention, the apparatus further comprises a control pad, and wherein the measuring further comprises a switch network that is electrically coupled to the control pad, the first supply pad, the second supply pad, and the resistor.

In accordance with an embodiment of the present invention, an apparatus is provided. The apparatus comprises a first supply pad; a second supply pad; a test pad; a control pad; and an integrated circuit having: a substrate; a capacitor having: an epitaxial layer of a first conduction type formed in the substrate; a buried layer of a second conduction type formed in the substrate and underlining the epitaxial layer; a well region of the second conduction type formed in the substrate and extending down to the buried layer so as to form a ring that in conjunction with the buried layer substantially surrounds the epitaxial layer; an isolator region of the first conduction type that is formed in the epitaxial layer; an isolation layer formed over at least a portion of the substrate and located over the at least a portion of the epitaxial layer, wherein the isolation layer is formed of a dielectric material; a polysilicon layer formed over at least a portion of the isolation layer; a dielectric layer that is formed over at least a portion of the polysilicon layer; a metallization layer having: a plate that is formed over at least a portion of the dielectric layer; and a cap that is formed over at least a portion of the dielectric layer, that is located over at least a portion of the isolator region, and that is spaced apart from the plate, and that is electrical coupled to the test pad; and a via that is electrically coupled to the cap and the third region and that extends through the isolation and dielectric layers; an internal circuit that is electrically coupled to the first supply pad, the second supply pad, the first conductive layer of the capacitor, and the plate.

In accordance with an embodiment of the present invention, the dielectric layer further comprises a first dielectric layer, and wherein the metallization layer further comprise a first metallization layer, and wherein the capacitor further comprises: a second dielectric layer that is formed over the first metallization layer; a second metallization layer that is formed over the second dielectric layer, wherein the second metallization layer is electrically coupled to the polysilicon layer; a third dielectric layer that is formed over the second metallization layer; and a third metallization layer that is formed over the third dielectric layer, wherein the third metallization layer is electrically coupled to first metallization layer.

In accordance with an embodiment of the present invention, each of the first, second, and third metallization layers is formed of aluminum or copper.

In accordance with an embodiment of the present invention, the first conduction type is P-type, and wherein the second conduction type is N-type.

In accordance with an embodiment of the present invention, the isolation layer and each of the first, second, and third dielectric layers are formed of silicon dioxide.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
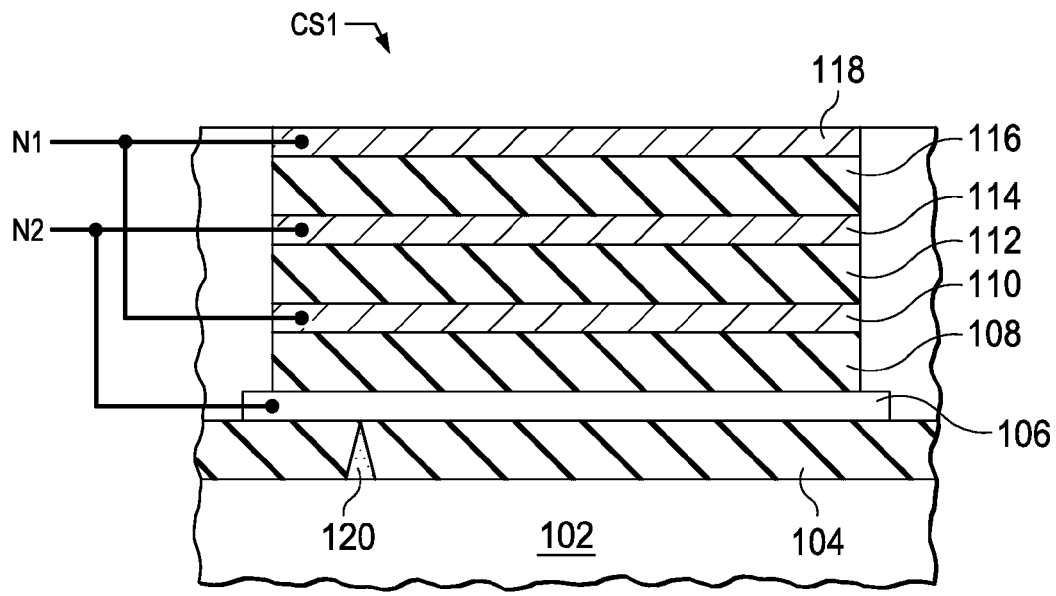
FIG. 1 is a cross-sectional view of a conventional capacitor.
Figure 2:
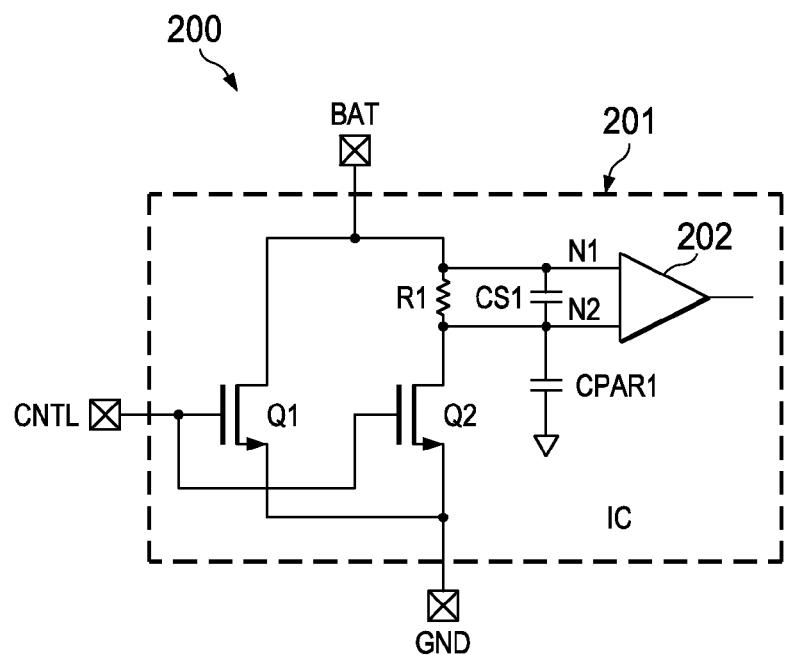
FIG. 2 is a diagram depicting a IC employing the capacitor of FIG. 1.
Figure 3:
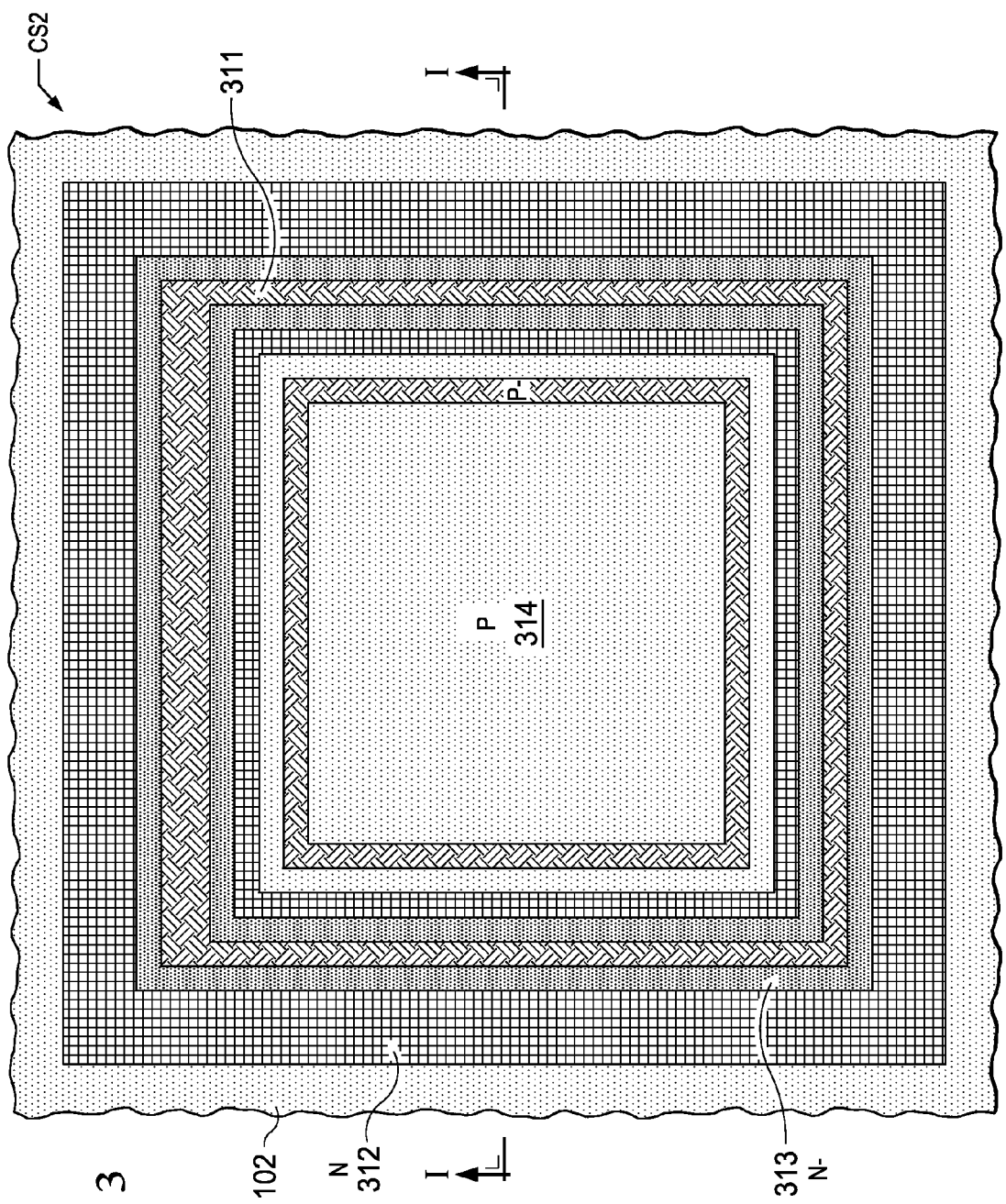
FIGS. 3, 5, 7, 9, and 11 are plan views of portions of an example of a capacitor in accordance with an embodiment of the present invention.
Figure 4:
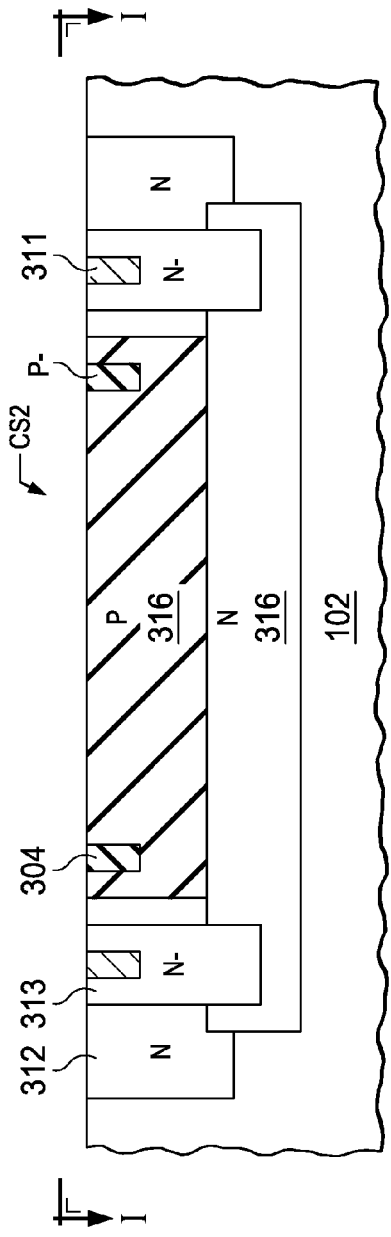
FIGS. 4, 6, 8, 10, and 12 are cross-sectional views of portions of the capacitor shown in FIGS. 3, 5, 7, 9, and 11 along section lines I-I, II-II, III-III, IV-IV, and V-V, respectively.
Figure 6:
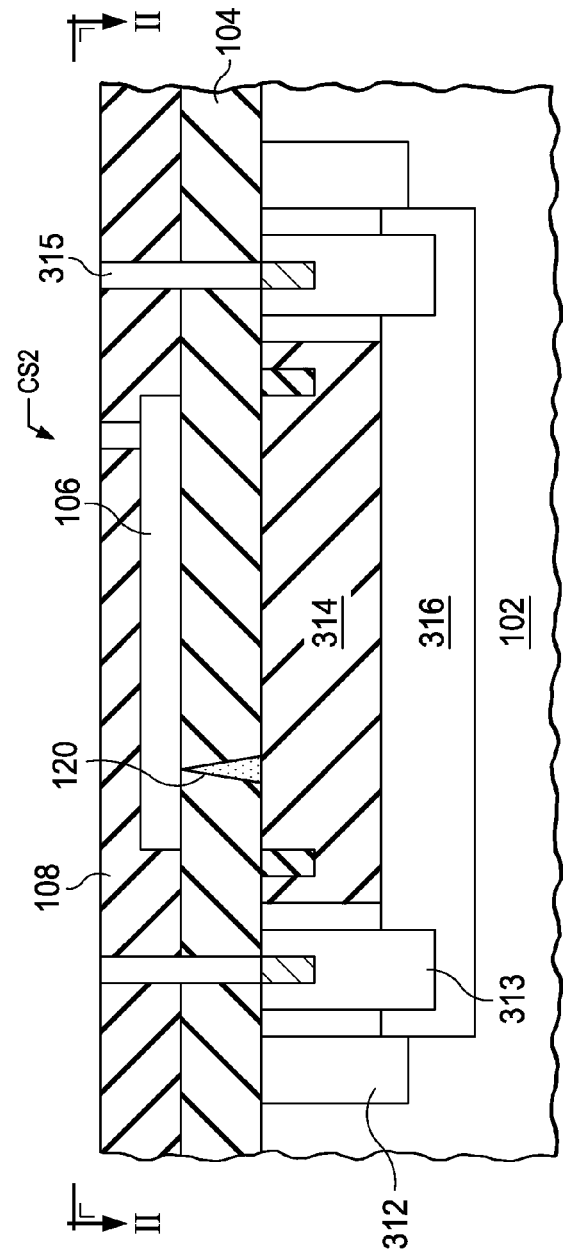
Figure 5:
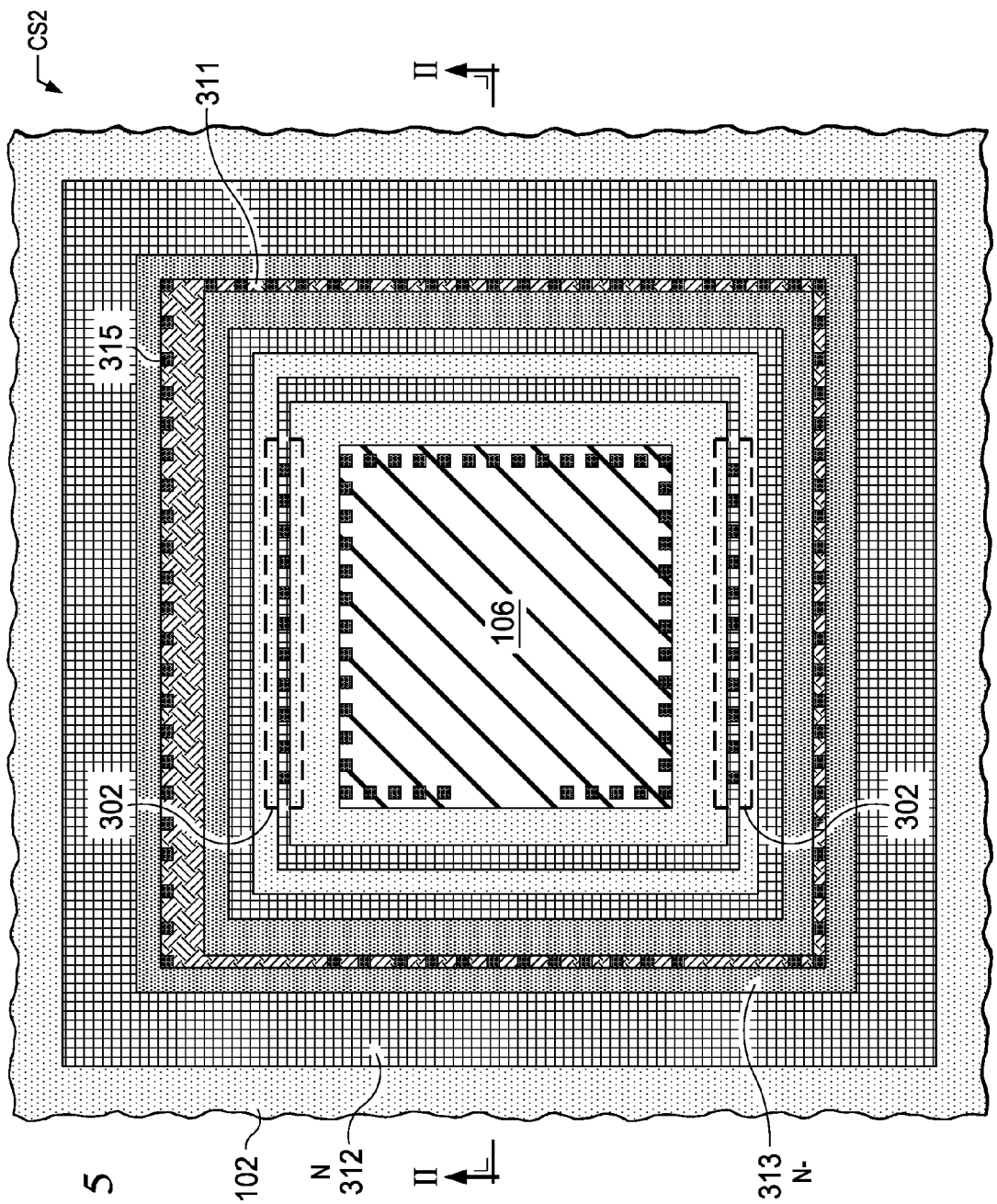
Figure 7:
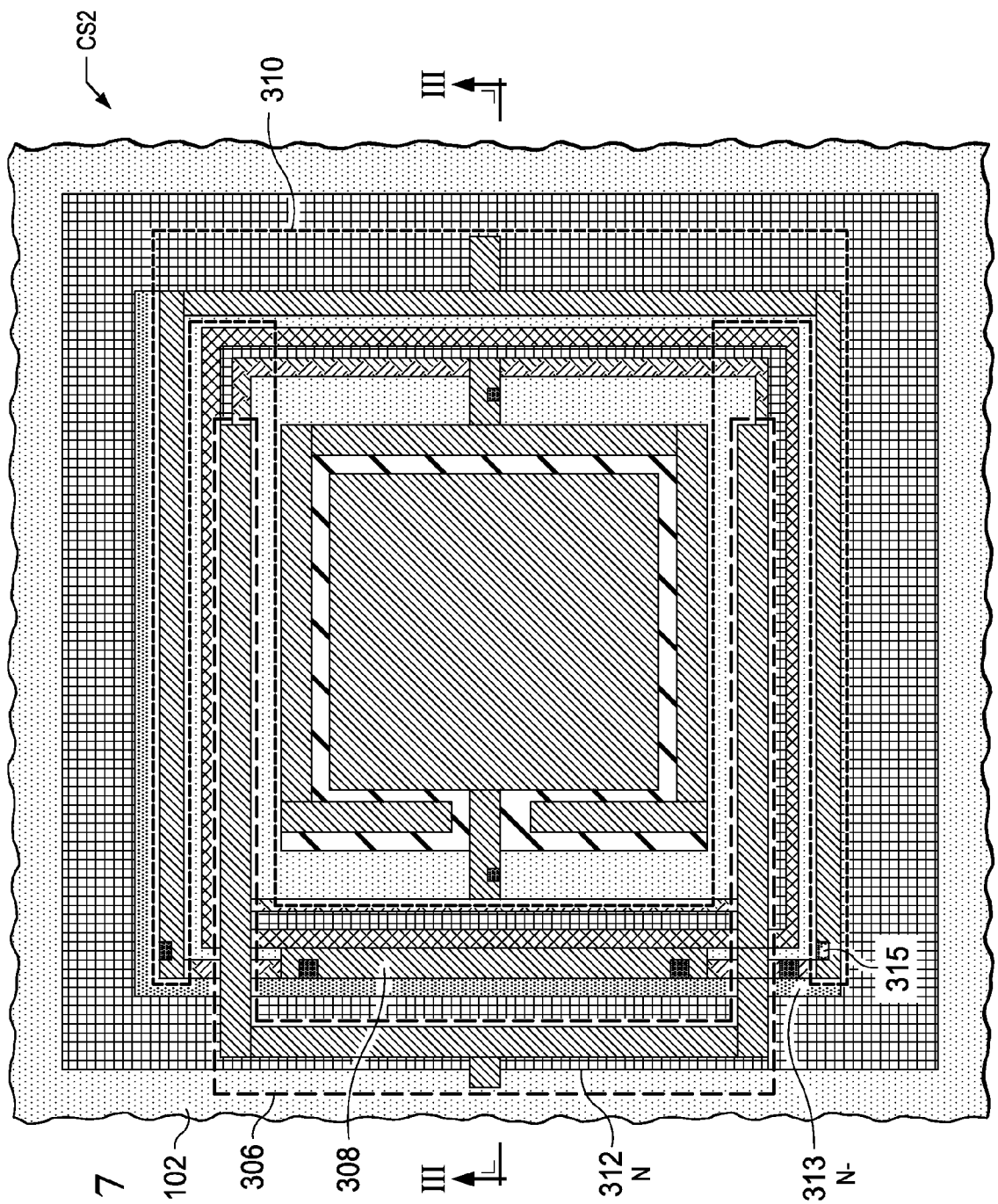
Figure 8:
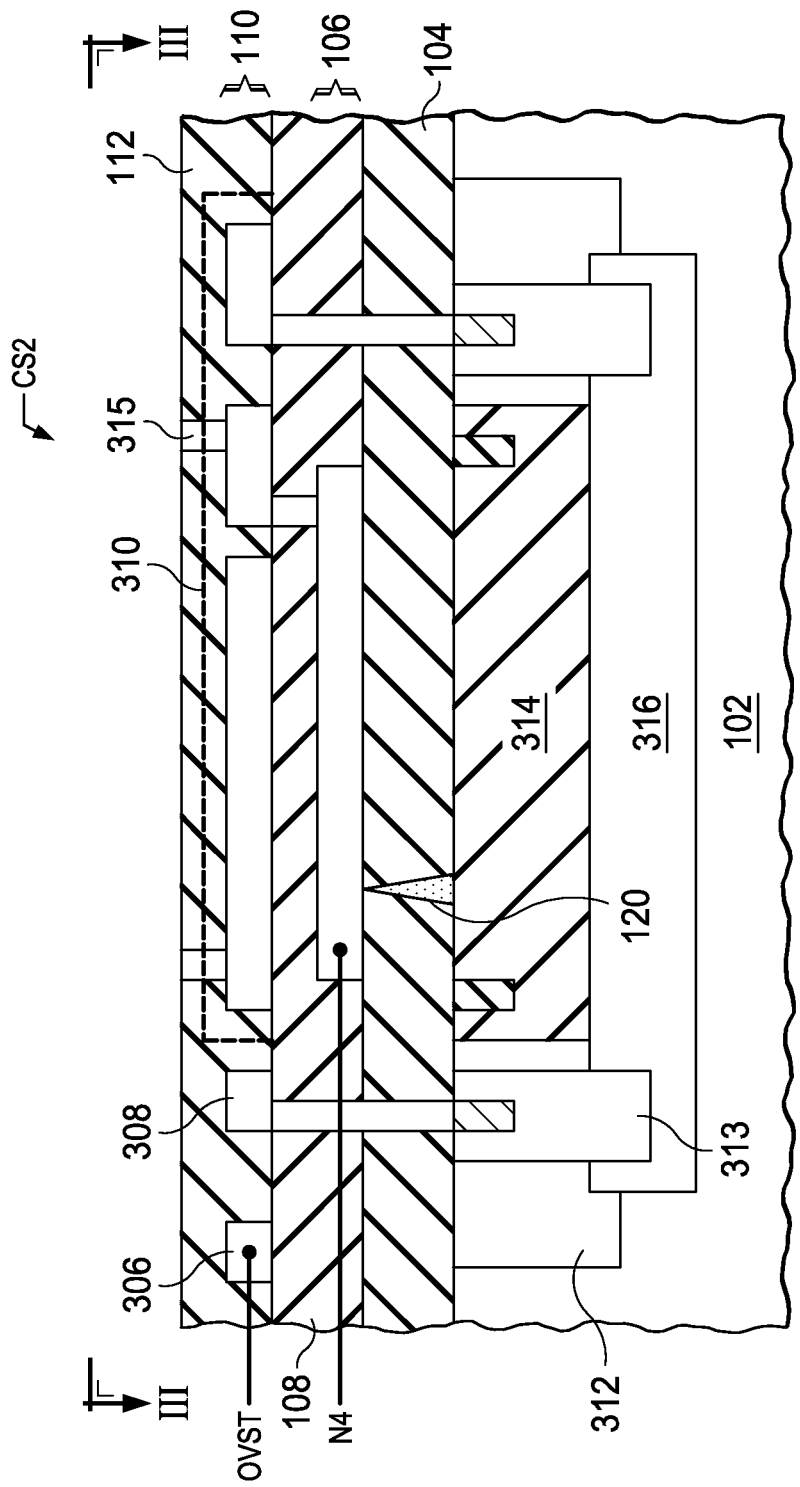
Figure 9:
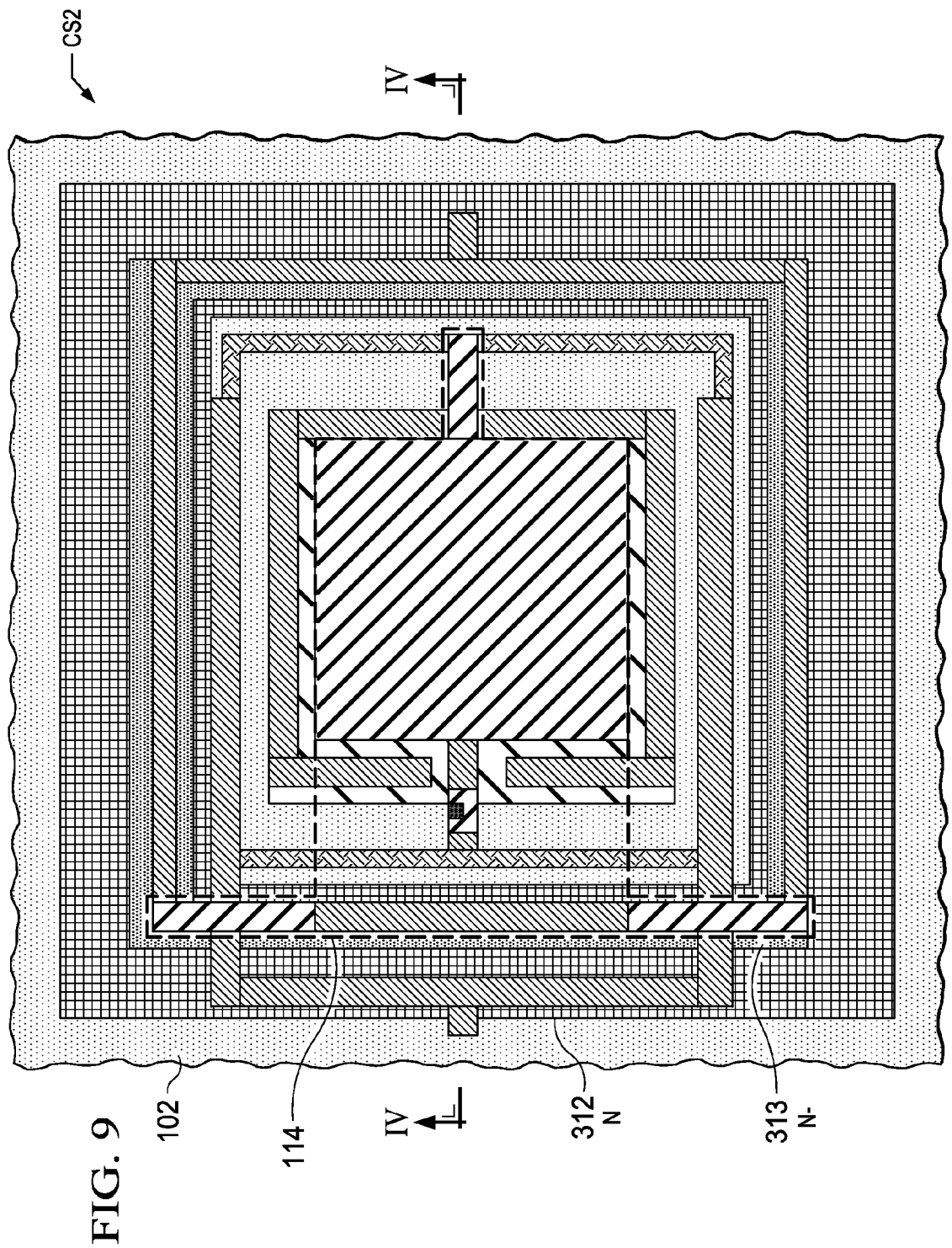
Figure 10:
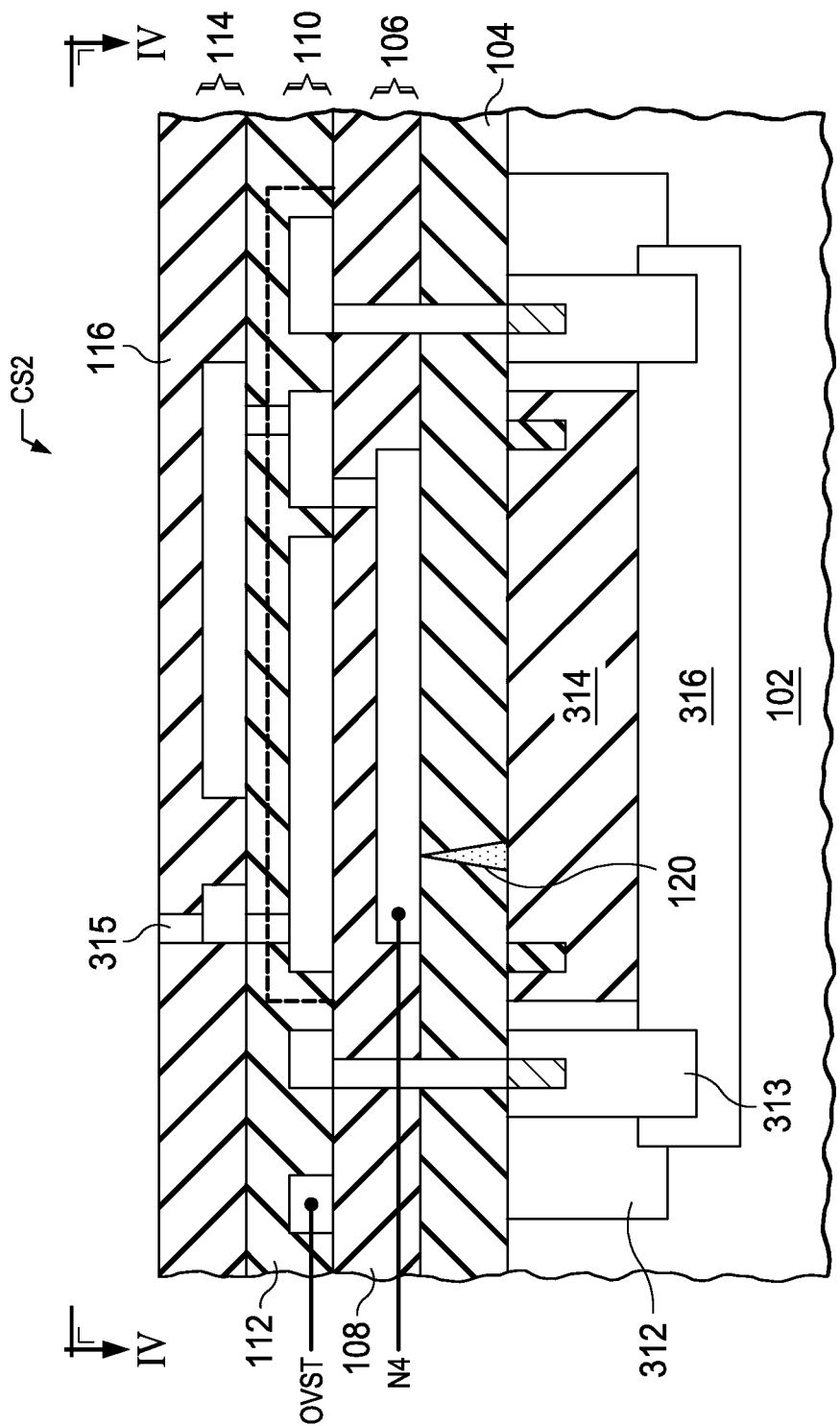
Figure 11:
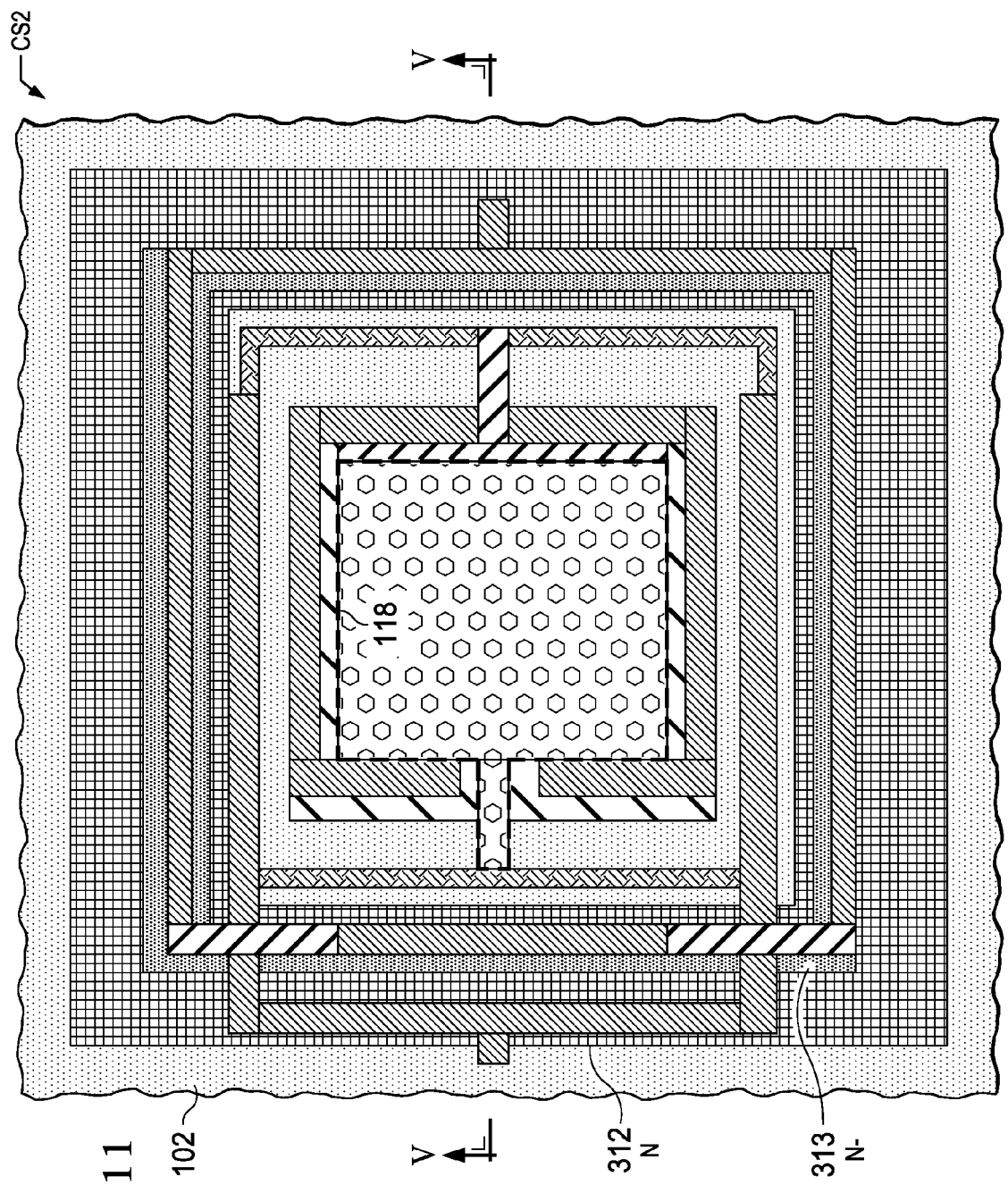
Figure 12:
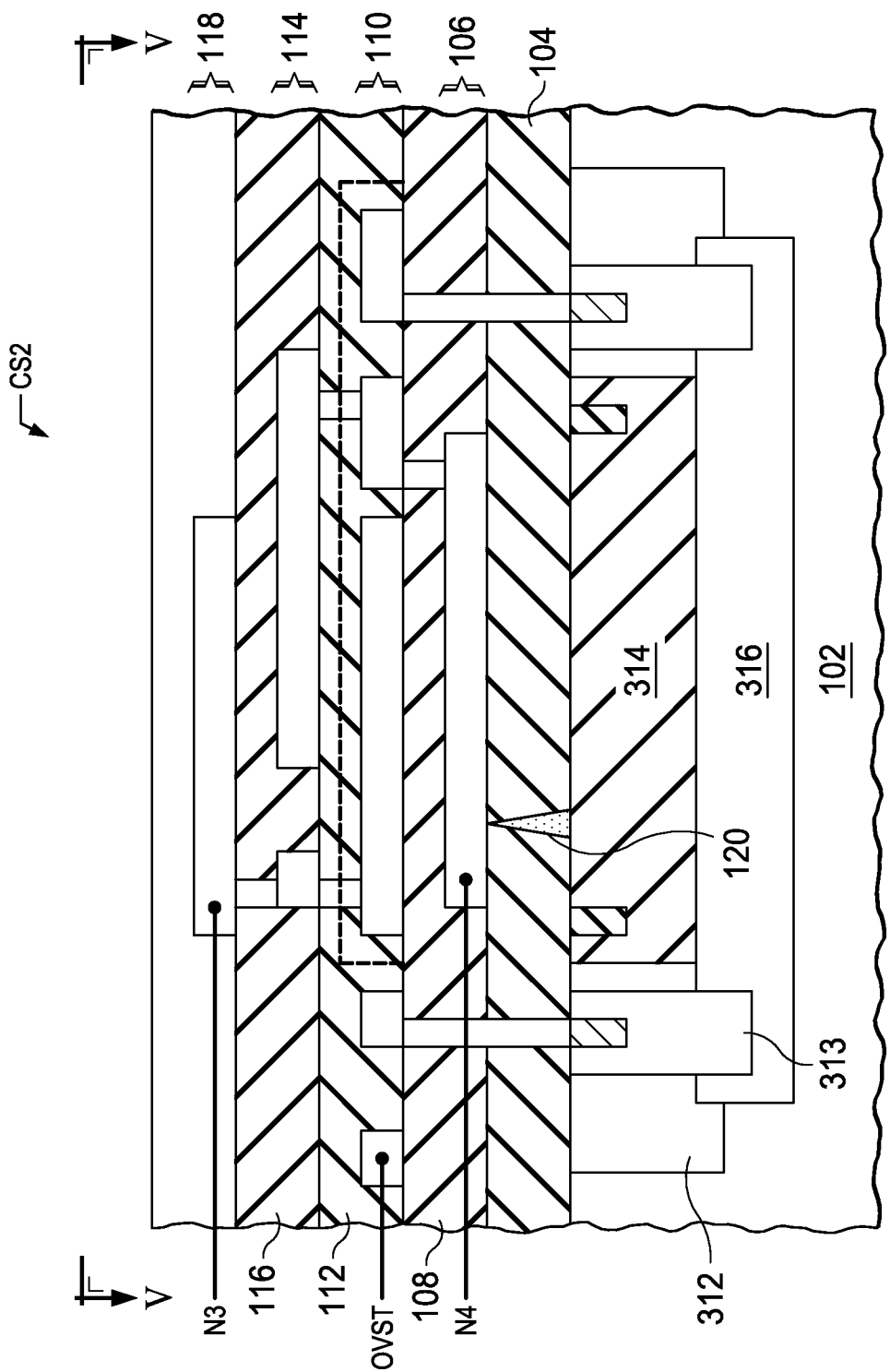

Refer now to the drawings wherein depicted elements are, for the sake of clarity, not necessarily shown to scale and wherein like or similar elements are designated by the same reference numeral through the several views.

Figure 13:
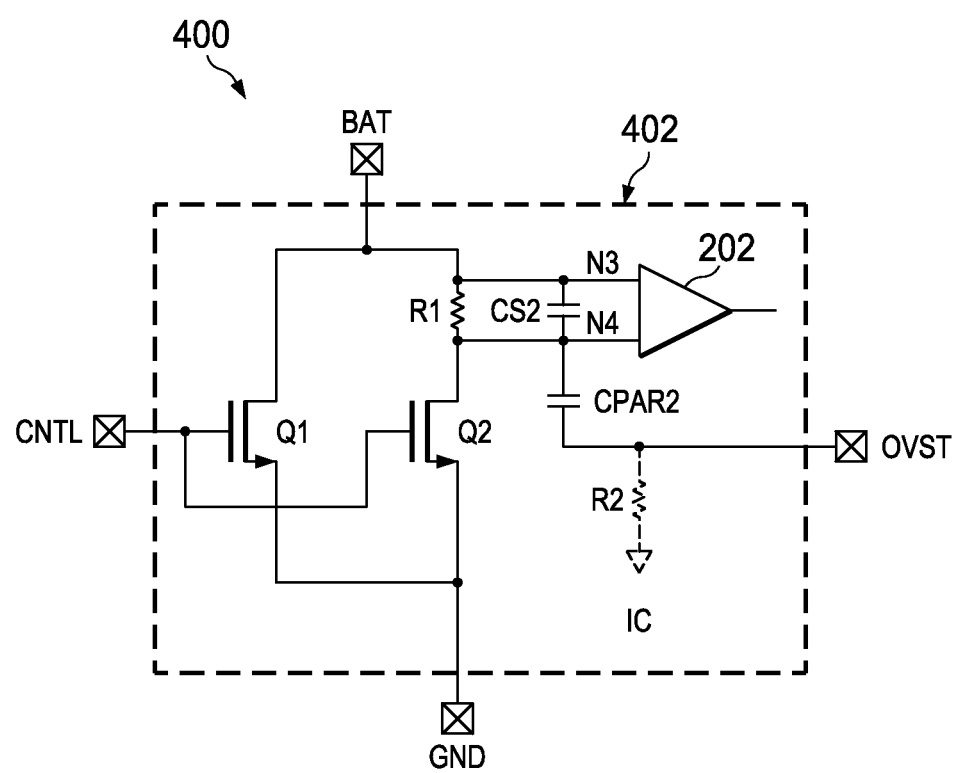
FIG. 13 is a diagram of an example of an IC employing the capacitor shown in FIGS. 3-12.

Turning to FIGS. 3-12, an example of a capacitor CS2 in accordance with an embodiment of the present invention is shown. This example capacitor CS2 is similar in construction to capacitor CS1, except that capacitor CS2 includes additional features to allow the parasitic capacitor CPAR2 (which is shown in FIG. 13) to have a different configuration than parasitic capacitor CPAR1. In this example, a well 312 (which can, for example, be an N-type well) and a deep well 313 (which, for example, can be an N-type well that is more heavily doped than well 312) are generally formed in a "ring" that extends down from the top surface of the substrate 102 to a buried layer 316. The wells 312 and 313 (which can collectively or individually be referred to as a well region) can then be tied or electrically coupled to ground with contact 311 (which can, for example, be an N-type region that is more heavily doped than well 313) through portion 308 of metallization layer 106. The buried layer 316 (which is usually of the same conduction type as the well 312 and which, for this example, is an N-type layer) underlies epitaxial layer 314 so that the layer 316 and wells 312 and 313 substantially surround layer 314. The epitaxial layer 314 is also generally of the opposite conduction type (which, for this example, is P-type) of the buried layer 316 and wells 312 and 313 to form a depletion region at the boundary between layer 314 and the buried layer 316/wells 312 and 313, creating diode(s). Then, to gain access to these underlying features, a decoupler is employed, which is electrically coupled to layer 314. To form this decoupler, metallization layer 110 is separated into a plate 310 (which is used for capacitor CS2) and a cap 306 (which is used for the decoupler). This cap 306 is then generally electrically coupled to isolator region (which can, for example, be formed in the substrate 304 so as to be generally surrounded by layer or region 314) with vias 302. The isolator region 304 is generally a doped region of the same conduction type as layer 314 but with a high doping concentration (i.e., P+), while vias 302 and 315 can, for example, be formed of tungsten. Metallization layers 110, 114, and 118 may, for example, also be formed of copper or aluminum and may be patterned and used for other unillustrated features (i.e., amplifier 202 of FIG. 13), and the dielectric layers 104, 108, 112, and 116 may, for example, be formed of silicon dioxide. Additionally, other features (such as interlayer dielectric materials) have been omitted for the sake of illustrated.

By using the underlying features and the decoupler, capacitor CS2 is constructed such that it can be isolated during OVST. As shown in example of FIGS. 8, 10, 12, and 13, cap layer 306 can be electrically coupled to pin OVST for IC 402 in system 400, while capacitor CS2 is coupled to amplifier 202 at nodes N3 and N4 in the internal circuit of IC 201. This allows a negative voltage to be applied to the pin OVST. When a negative voltage is applied to pin OVST in this example, the diode(s) formed between layer 314 and wells 312 and 313/layer 316 are reverse biased, isolating the bottom plate (i.e., layer 314) of parasitic capacitor CPAR2 (which is generally formed by polysilicon layer 106, dielectric layer 104, and layer 314). The isolation of layer 314 then allows capacitor to be safely stressed to 128V, for example, or greater so long as a proper breakdown voltage for the diode(s) can be maintained. For this example, the breakdown voltage(s) for the diodes is greater than about 80V. Once testing has been completed, the pin OVST can be bonded (i.e., wire bonded) to pin GND or be electrically coupled to pin GND via resistor R2. It should also be noted that IC 402 may include multiple capacitors (i.e., similar to capacitor CS2) that should be subjected to OVST, and it is possible include a decoupler for each capacitor with its cap 306 being electrically coupled to pin OVST so as to allow all capacitors to be subjected to OVST substantially at the same time.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a substrate having:
a first region of a first conductivity type;
a second region of a second conductivity type that is substantially surrounded by the first region; and
a third region of the first conductivity type that is substantially surrounded by the second region;
a first dielectric layer formed over at least a portion of the substrate and located over the first, second, and third regions;
a first conductive layer formed over at least a portion of the first dielectric layer and located over at least a portion of the first and second regions, wherein the first conductive layer is configured to form a first electrode of a capacitor;
a second dielectric layer that is formed over at least a portion of the first conductive layer and located over at least a portion of the first, second, and third regions;
a second conductive layer having:
a plate that is formed over at least a portion of the second dielectric layer and that is located over at least a portion of the first and second regions, wherein the plate is configured to form a second electrode of the capacitor, wherein the plate is electrically coupleable to a first test pad and a second test pad; and
a cap that is formed over at least a portion of the second dielectric layer, that is located over at least a portion of the first, second, and third regions, and that is spaced apart from the plate wherein the plate can be electrically coupled to a test pad; and
a via that is electrically coupled to the cap and the third region and that extends through the first and second dielectric layers.

2. The apparatus of claim 1, wherein the substrate has a top surface, and wherein the first region further comprises:
a buried layer of the first conductivity type that underlies the second region; and
a well region that extends from the top surface to buried layer and that located along the periphery of the second region.

3. The apparatus of claim 2, wherein the third region is more heavily doped than the second region.

4. The apparatus of claim 3, wherein the first conductive layer is polysilicon, and wherein the second conductive layer is a metallization layer.

5. The apparatus of claim 4, wherein the metallization layer is formed of aluminum or copper.

6. The apparatus of claim 5, wherein the second region is an epitaxial layer.

7. The apparatus of claim 6, wherein the first dielectric layer is an oxide isolation layer, and wherein the well region and buried layer are N-type regions, and wherein the second region is a P-type region.

8. An apparatus comprising:
a first supply pad;
a second supply pad;
a test pad; and
an integrated circuit having:
a substrate;
a capacitor having:
a first region of a first conductivity type formed in the substrate;
a second region of a second conductivity type that is formed in the substrate and that is substantially surrounded by the first region; and a third region of the first conductivity type that is formed in the substrate and that is substantially surrounded by the second region;
a first dielectric layer formed over at least a portion of the substrate and located over the first, second, and third regions;
a first conductive layer formed over at least a portion of the first dielectric layer and located over at least a portion of the first and second regions;
a second dielectric layer that is formed over at least a portion of the first conductive layer and located over at least a portion of the first, second, and third regions;
a second conductive layer having:
a plate that is formed over at least a portion of the second dielectric layer and that is located over at least a portion of the first and second regions; and
a cap that is formed over at least a portion of the second dielectric layer, that is located over at least a portion of the first, second, and third regions, and that is spaced apart from the plate, and that is electrically coupled to the test pad; and
a via that is electrically coupled to the cap and the third region and that extends through the first and second dielectric layers; and
an internal circuit that is electrically coupled to the first supply pad, the second supply pad, the first conductive layer of the capacitor, and the plate.

9. The apparatus of claim 6, wherein the substrate has a top surface, and wherein the first region further comprises:
a buried layer of the first conductivity type that underlies the second region; and
a well region that extends from the top surface to buried layer and that located along the periphery of the second region.

10. The apparatus of claim 7, wherein the third region is more heavily doped than the second region.

11. The apparatus of claim 8, wherein the first conductive layer is polysilicon, and wherein the second conductive layer is a metallization layer.

12. The apparatus of claim 9, wherein the metallization layer is formed of aluminum or copper.

13. The apparatus of claim 10, wherein the second region is an epitaxial layer.

14. The apparatus of claim 11, wherein the first dielectric layer is an oxide isolation layer, and wherein the well region and buried layer are N-type regions, and wherein the second region is a P-type region.

15. The apparatus of claim 12, wherein the first conductive layer of the capacitor is electrically coupled to the first supply pad, and wherein the internal circuit further comprises:
a resistor that is electrically coupled to the first supply pad; and
an amplifier that is electrically coupled to the first supply pad and the test pad.

16. The apparatus of claim 13, wherein the apparatus further comprises a control pad, and wherein the measuring further comprises a switch network that is electrically coupled to the control pad, the first supply pad, the second supply pad, and the resistor.

17. An apparatus comprising:
a first supply pad;
a second supply pad;
a test pad;
a control pad; and
an integrated circuit having:
a substrate;
a capacitor having:
an epitaxial layer of a first conduction type formed in the substrate;
a buried layer of a second conduction type formed in the substrate and underlining the epitaxial layer;
a well region of the second conduction type formed in the substrate and extending down to the buried layer so as to form a ring that in conjunction with the buried layer substantially surrounds the epitaxial layer;
an isolation layer formed over at least a portion of the substrate and located over the at least a portion of the epitaxial layer, wherein the isolation layer is formed of a dielectric material;
a polysilicon layer formed over at least a portion of the isolation layer;
a dielectric layer that is formed over at least a portion of the polysilicon layer;
a metallization layer having:
a plate that is formed over at least a portion of the dielectric layer; and
a cap that is formed over at least a portion of the dielectric layer, that is located over at least a portion of the isolater region, and that is spaced apart from the plate, and that is electrical coupled to the test pad; and
a via that is electrically coupled to the cap and a third region and that extends through the isolation and dielectric layers;
an internal circuit that is electrically coupled to the first supply pad, the second supply pad, the first conductive layer of the capacitor, and the plate.

18. The apparatus of claim 15, wherein the dielectric layer further comprises a first dielectric layer, and wherein the metallization layer further comprise a first metallization layer, and wherein the capacitor further comprises:
a second dielectric layer that is formed over the first metallization layer;
a second metallization layer that is formed over the second dielectric layer, wherein the second metallization layer is electrically coupled to the polysilicon layer;
a third dielectric layer that is formed over the second metallization layer; and
a third metallization layer that is formed over the third dielectric layer, wherein the third metallization layer is electrically coupled to first metallization layer.

19. The apparatus of claim 16, wherein each of the first, second, and third metallization layers is formed of aluminum or copper.

20. The apparatus of claim 17, wherein the first conduction type is P-type, and wherein the second conduction type is N-type.

21. The apparatus of claim 18, wherein the isolation layer and each of the first, second, and third dielectric layers are formed of silicon dioxide.

* * * * *